US006672413B2

(12) United States Patent
Moore et al.

(10) Patent No.: US 6,672,413 B2
(45) Date of Patent: Jan. 6, 2004

(54) REMOTE CONTROLLED INSPECTION VEHICLE UTILIZING MAGNETIC ADHESION TO TRAVERSE NONHORIZONTAL, NONFLAT, FERROMAGNETIC SURFACES

(75) Inventors: Charles C. Moore, Hibbs, PA (US); James A. Bauer, Gibsonia, PA (US); Mark W. Fischer, Pittsburgh, PA (US); Harry L. Sill, Pittsburgh, PA (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 2 days.

(21) Appl. No.: 09/995,182

(22) Filed: Nov. 27, 2001

(65) Prior Publication Data

US 2002/0104693 A1 Aug. 8, 2002

Related U.S. Application Data

(60) Provisional application No. 60/253,675, filed on Nov. 28, 2000.

(51) Int. Cl.$^7$ ............................................ B62D 55/065
(52) U.S. Cl. ...................................... 180/9.21; 180/9.48
(58) Field of Search ........................... 180/9, 9.1, 9.21, 180/9.4, 9.48, 9.46, 901; 280/5.22, 5.28; 901/1, 30, 41, 44, 46, 47; 305/6

(56) References Cited

U.S. PATENT DOCUMENTS

| | | | | |
|---|---|---|---|---|
| 3,998,286 A | * | 12/1976 | Ponikelsky et al. ........ | 180/9.48 |
| 4,341,276 A | * | 7/1982 | Furuichi ..................... | 180/9.48 |
| 4,457,388 A | * | 7/1984 | Koehler et al. ............ | 180/9.48 |
| 4,519,465 A | * | 5/1985 | Triplett ...................... | 180/9.48 |
| 4,664,212 A | | 5/1987 | Nagatsuka et al. | |
| 4,709,773 A | * | 12/1987 | Clement et al. ........... | 280/5.28 |
| 4,828,059 A | | 5/1989 | Naito et al. | |
| 5,022,812 A | | 6/1991 | Coughlan et al. | |
| 5,125,467 A | | 6/1992 | Mancheron | |
| 5,148,882 A | | 9/1992 | Carra et al. | |
| 5,174,405 A | | 12/1992 | Carra et al. | |
| 5,186,270 A | * | 2/1993 | West .............................. | 901/1 |
| 5,248,008 A | | 9/1993 | Clar | |
| 5,293,949 A | * | 3/1994 | Zimmermann ............. | 180/9.48 |
| 5,363,935 A | | 11/1994 | Schempf et al. | |
| 5,435,405 A | * | 7/1995 | Schempf et al. ................ | 901/1 |
| 5,465,525 A | * | 11/1995 | Mifune et al. .................. | 901/1 |
| 5,517,416 A | | 5/1996 | Torii et al. | |
| 5,894,901 A | | 4/1999 | Awamura et al. | |
| 6,374,933 B1 | * | 4/2002 | Ruppert, Jr. et al. ....... | 180/9.48 |
| 6,394,204 B1 | * | 5/2002 | Haringer .................... | 180/9.48 |

* cited by examiner

Primary Examiner—Lesley D. Morris
Assistant Examiner—Matthew Luby

(57) ABSTRACT

A remote controlled inspection vehicle provides interchangeable modules, permitting the vehicle to be easily configured to perform a wide variety of tasks. The vehicle includes at least one frame module having a pair of drive modules on either side. Each drive module includes a continuous track surrounding a permanent magnet, and is dimensioned and configured to pivot around its longitudinal axis. The frame modules are dimensioned and configured to be hingedly secured to other frame modules, end effectors including various sensors for performing inspections, and tail units to assist in placing the vehicle in the desired environment.

17 Claims, 11 Drawing Sheets

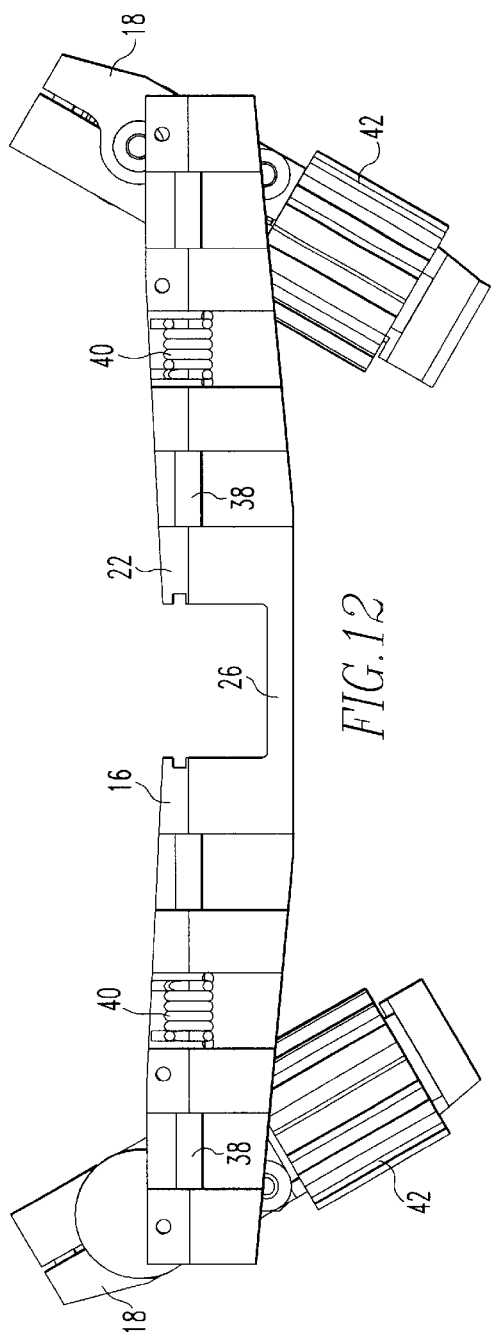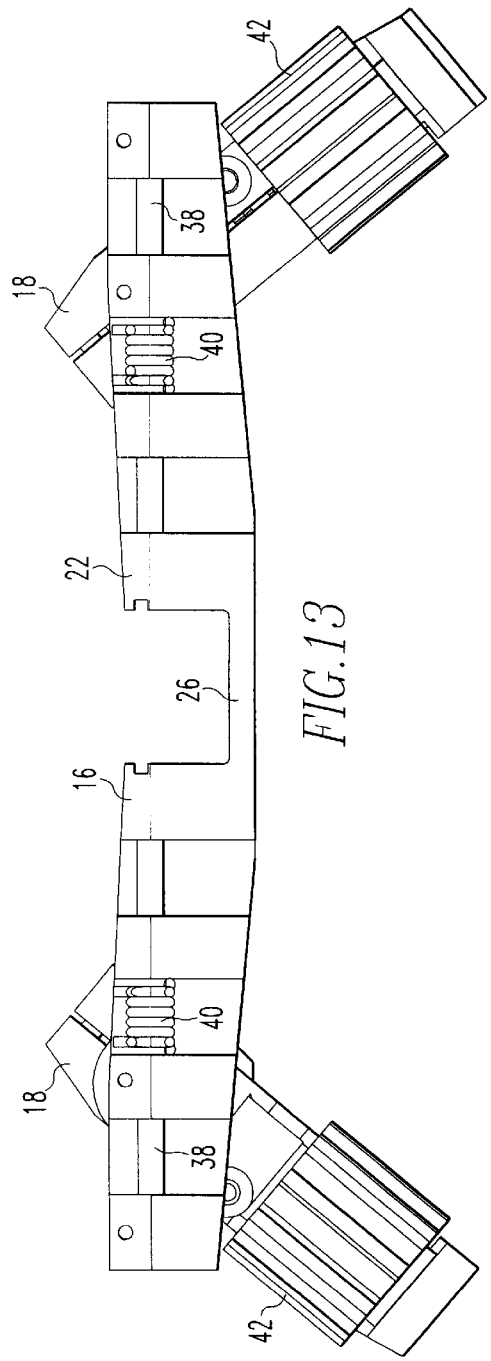

REMOTE CONTROLLED INSPECTION VEHICLE UTILIZING MAGNETIC ADHESION TO TRAVERSE NONHORIZONTAL, NONFLAT, FERROMAGNETIC SURFACES

CROSS REFERENCE TO RELATED APPLICATION

This application claims the benefit of U.S. Provisional Patent Application Ser. No. 60/253,675, filed Nov. 28, 2000.

BACKGROUND OF THE INVENTION

1. Field of the Invention

The present invention relates to remote controlled, unmanned inspection vehicles. More specifically, the present invention relates to inspection vehicles capable of entry into highly constrained spaces, and traversing nonhorizontal and/or nonflat ferromagnetic surfaces through magnetic adhesion to such surfaces.

2. Description of the Related Art

It is frequently necessary to perform inspections of machinery, storage tanks, etc. where highly constrained entry points and/or environmental hazards make direct human inspection either impossible or inadvisable. Examples include electrical generators and other machinery having highly constrained travel spaces between the various moving components, storage tanks wherein chemical hazards are present, such as underground gasoline tanks, and pools containing nuclear reactor spent fuel wherein radiation hazards are present. Frequently, access to various regions that must be inspected requires traversing nonhorizontal surfaces, such as angled components and/or walls, and/or nonflat surfaces, such as the exterior or interior of pipes.

One proposed remote controlled inspection vehicle is described in U.S. Pat. No. 5,363,935, issued to H. Schempf et al. on Nov. 15, 1994. The vehicle includes at least one frame member supporting a continuous track, a magnet, a fixed magnetic element, and a movable magnetic element. The movable magnetic element forms one side of a rotatable cylinder surrounding the drive shaft operatively connecting the motor and tracks, so that it may engage the drive shaft when movement is desired. The fixed magnetic element includes a pair of magnetic pieces on either side of the cylinder, with one piece including the permanent magnet, and legs terminating in rollers contacting the tracks. Each track cleat includes a nonmagnetic center portion and magnetic end portions. When the movable magnetic element is in a first position wherein it forms a magnetic flux path between the fixed magnetic pieces, thereby forming a complete flux path including the movable piece, 2 fixed pieces, ends of the track cleats, and the surface upon which the vehicle is travelling, the vehicle is magnetically secured to the inside surface of the tank. When the movable magnetic element is rotated to its second position, the magnetic flux path is broken, and the vehicle is not magnetically secured to the interior surface of the tank. A pair of such frame units are connected to either end of a sensor unit through steering units. An alternative embodiment utilizes a track wherein the cleats are made from magnetic material with copper bars extending across the width of each end of the cleats, and a ferromagnetic plate extending across the length of the plate. The ferromagnetic plate is surrounded by a coil in electrical contact with the copper bars at each end. Electrical current is supplied to additional copper bars adjacent to the track, so that when the copper bars extending across the width of the track are brought into contact with these copper bars, the cleat becomes an electromagnet. The steering unit includes a yaw actuator and a pitch actuator, both of which are actuated by electric motors and gear arrangements. Sensors may include ultrasonic inspection sensors, cameras, acoustic navigation systems, vapor sensors, radiation detectors, etc. A tether line is used to supply power and control functions. This patent does not describe a means for rotating the tracks of the vehicle around their longitudinal axis.

U.S. Pat. No. 4,828,059, issued to S. Naito et al. on May 9, 1989, describes a wall-crawling machine having permanent magnets within the tracks. One embodiment uses two sets of tracks, pivotally connected with each other, so that movement of the rear track towards a wall causes the forward track to align itself with the wall and adhere to the wall. Movement of the front track up the wall then angles the rear track to align it with the wall. A second embodiment utilizes permanent magnets attached to a pivoting arm to pull the vehicle up onto a wall. A third embodiment has laterally-extendable tracks for performing a transverse walking function.

U.S. Pat. No. 4,664,212, issued to K. Nagatsuka et al. on May 12, 1987, describes a remote controlled, tracked vehicle having suction chambers with apertures in the tracks. A centrally mounted suction apparatus is mounted adjacent to the central portion of each track, and sucks air through the suction chambers located near the central portion of the vehicle to retain the vehicle on a surface.

U.S. Pat. No. 5,894,901, issued to N. Awamura et al. on Apr. 20, 1999, describes an endless magnetic track for a vehicle, having a plurality of magnets coupled in series with the chain, and a means for providing slack within the tracks when traversing uneven terrain.

Accordingly, a remote controlled inspection vehicle capable of fitting into extremely small spaces, for example, between the rotor and stator of an electrical generator, is desired. Additionally, a remote controlled inspection vehicle having propulsion units that are rotatable about their longitudinal axis for traversing concave and convex surfaces, for example, the interior and exterior of pipes, is desired. Further, a remote controlled inspection vehicle having an adjustable distance between the propulsion tracks is desired. A remote controlled inspection vehicle having replaceable modular tracks for different operations is also desired.

SUMMARY OF THE INVENTION

The present invention is a remote controlled inspection vehicle for performing inspections in areas inaccessible to human inspectors due to small size and/or hazardous conditions.

The inspection vehicle of the present invention includes at least one frame, dimensioned and configured to receive a pair of drive modules. The frame includes a longitudinal beam that is preferably hollow, permitting it to contain wiring for supplying electrical power and control signals, and for transmitting information detected during the inspection. Front and rear transverse beams are located at each end of the longitudinal beam, and are dimensioned and configured to support the drive modules, and to pivotally secure the frame to another frame and/or a tail.

Each drive module includes a motor, a gear box operatively connected to the motor, track drive wheels operatively connected to the gear box, and a continuous track. Each drive module is dimensioned and configured to be mounted on one side of the frame, supported between the front and rear transverse beams. A magnet, preferably a permanent magnet, is surrounded by the continuous track, and is dimensioned and configured to secure the vehicle to a ferromagnetic surface upon which the track is placed. The drive module may also include an encoder operatively connected to the motor, and being dimensioned and configured to transmit an electronic signal corresponding to a rotation of the motor. The drive module includes a mounting bracket at each end, with each mounting bracket having means to secure the mounting bracket to either the front or rear beam of the frame. One preferred means is a plurality of holes in both the frame and the mounting bracket, so that the distance between the drive module and the frame's longitudinal member may be selected as desired by lining up the appropriate holes, and bolting the bracket to the frame. The brackets also include a pivot, dimensioned and configured to permit the drive module to pivot about its longitudinal axis, thereby permitting the track to lie substantially flat when the vehicle is traversing a nonflat surface, for example, the inside or outside of a pipe.

The front and rear edges of the frame include means for pivotally securing the frame to an identical frame, to an effector, and/or to a tail. One preferred means is a spring-biased hinge, defining a pivot substantially parallel to the front and rear transverse beams 22,24. The hinge is preferably spring-biased to maintain the components in a linear fashion. Typically, a complete vehicle will include either one or two such frames, with one frame being selected where minimized vehicle size is priority, and two frames being selected where the greater adhesion to the surface provided by the additional magnetic track modules is desirable. A tail may be hingedly secured to the rearmost frame to aid insertion into the location where inspection is desired. The vehicle may also include various effectors, which may preferably be hingedly secured to the vehicle's front end, although other locations within the vehicle are permissible.

Several different effectors may be utilized with a vehicle of the present invention. For example, the effector may include a hammer mechanism designed to strike a surface, and a capacitive measurement probe to sense movement of the surface. The end effector may also include a camera. Another possible effector includes a loop cable and reference source for generating a magnetic field within the effector, a reference coil, and a sense coil on the underside of the effector. The difference in magnetic fields can indicate shorts between generator laminations. Other possible end effectors include ultrasonic inspection sensors, acoustic navigation systems, vapor sensors, and radiation detectors.

In use, the desired vehicle components may first be assembled. The modular construction of the vehicle permits the various components to be assembled in many different configurations, for example, any drive module may be placed anywhere on either the right or left side of the vehicle. A typical completed vehicle will include either one or two frames, depending on the size and/or ability to retain itself on a ferromagnetic surface. Drive modules with different size tracks may be utilized, depending upon the terrain and/or space limitations of the environment wherein inspection is desired. The tail may be mounted on the back end of the vehicle to assist in placing the vehicle in the desired location. The appropriate effector is mounted on the vehicle, depending upon the desired inspection to be performed. The vehicle is then inserted into the desired location, for example, between the rotor and stator of an electrical generator, wherein the vehicle may traverse either any horizontal surface, or any ferromagnetic surface to which the magnets inside the tracks may adhere. Power and control signals are supplied to the vehicle through cables extending from a remote controller to the vehicle, and data retrieved by the end effector are transmitted back to the remote controller for collection and analysis through additional cables. The encoders transmit signals back to the remote controllers corresponding to rotations of the motors, thereby permitting the position of the vehicle to be calculated based on the distance the vehicle will travel per rotation of the motor. Each drive module may be driven at different speeds when steering is desired, driving the tracks on one side of the vehicle at a faster speed than the tracks on the other side of the vehicle. If desired, it is possible to drive the tracks on one side of the vehicle one direction and the tracks on the other side of the vehicle the other direction, so that the vehicle may rotate about a stationary point. Additionally, an optional camera may assist in determining the location of the vehicle. The vehicle will traverse the various surfaces within the environment, perform the desired inspections, transmit the information back to the operators, and be retrieved from the environment.

It is therefore an aspect of the present invention to provide a remotely controlled inspection vehicle for operation within environments where space limitations and/or hazards prevent direct human inspections.

It is another aspect of the present invention to provide a remote controlled inspection vehicle capable of fitting into unusually small spaces.

It is a further aspect of the present invention to provide a remotely controlled inspection vehicle wherein the drive modules may pivot about the longitudinal axis, and the frames, effectors, and tail pivot with respect to each other about a transverse axis, thereby permitting maximized contact between each of the tracks and various irregular surfaces.

It is another aspect of the present invention to provide a remote controlled inspection vehicle having modular, interchangeable components.

It is a further aspect of the present invention to provide a remote controlled inspection vehicle wherein the distance between tracks within each frame may be varied as desired.

These and other aspects of the invention will become apparent through the following description and drawings.

BRIEF DESCRIPTION OF THE DRAWINGS

FIG. 12 is a front view of a complete frame unit for an inspection vehicle of the present invention, illustrating the drive modules rotated significantly, thereby facing the tracks further outward.

FIG. 13 is a front view of a remote controlled inspection vehicle according to the present invention, showing the maximum degree of rotation permitted for the drive modules.

Like reference numbers denote like elements throughout the drawings.

DETAILED DESCRIPTION

Figure 1:
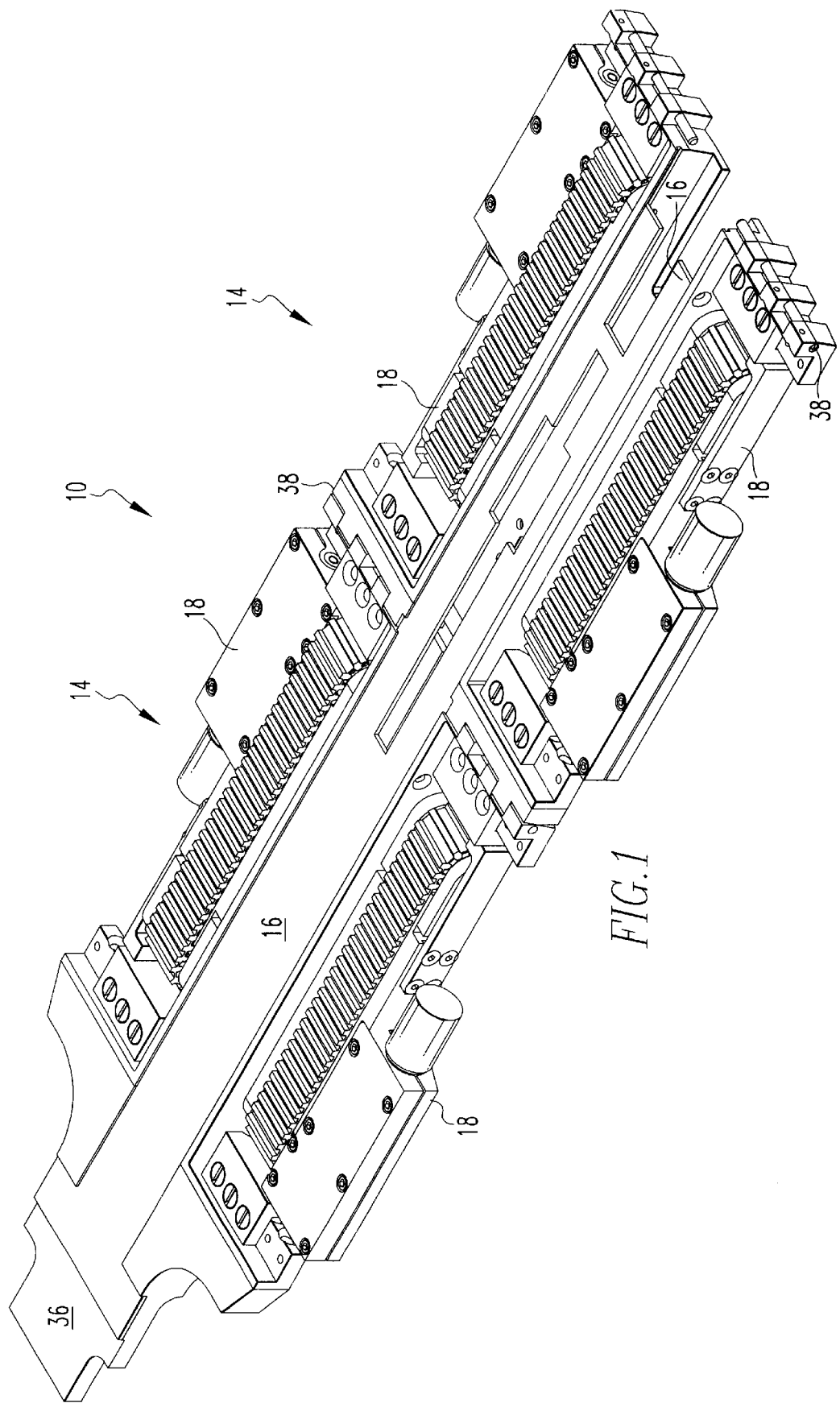
FIG. 1 is a top isometric view of a remote controlled inspection vehicle according to the present invention, illustrating two frame modules and a tail module.
Figure 2:
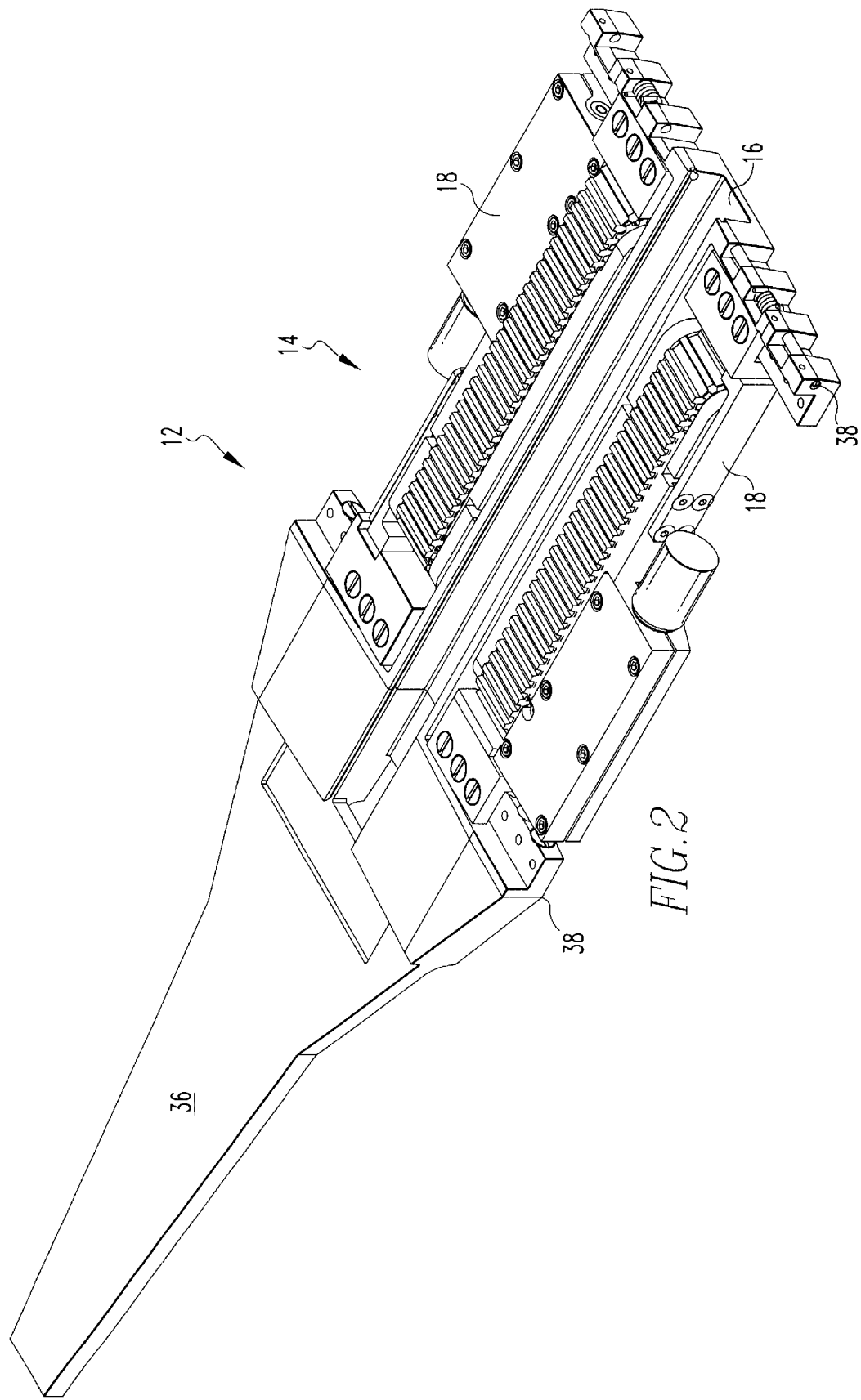
FIG. 2 is a top isometric view of a remote controlled inspection vehicle according to the present invention, illustrating a single frame module and a tail module.

The preferred embodiments of the present invention are various configurations of a remote controlled inspection vehicle capable of traversing non-horizontal, ferromagnetic surfaces, and non-flat surfaces. Referring to FIGS. 1 and 2, a first vehicle embodiment 10 and second vehicle embodiment 12 are illustrated. The vehicle embodiments 10, 12 differ in the number of frame/drive module assemblies 14 present, with the vehicle 10 having two frame/drive module assemblies 14, and the vehicle 12 having a single frame/drive module assembly 14. Each frame/drive module assembly 14 includes a frame 16, having a drive module 18 on either side. Additionally, the vehicle embodiments 10,12 are illustrated with different tail sections 36 (described below), with the tail section 36 being user-selectable based on the desired use of the vehicle 10,12.

Figure 3:
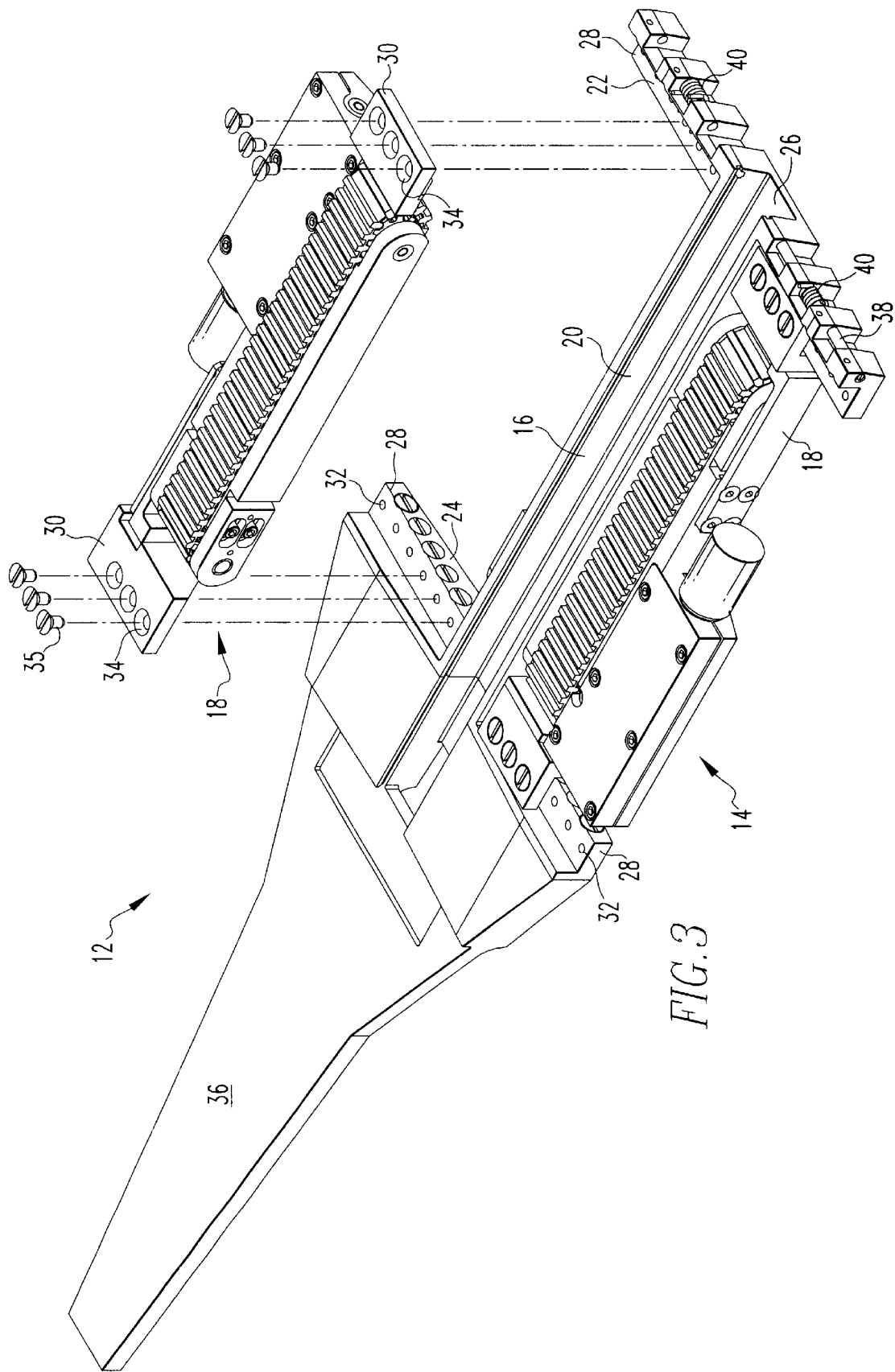
FIG. 3 is a partially exploded, isometric view of a remote controlled inspection vehicle according to the present invention, illustrating a single frame module and a tail module.

Referring to FIG. 3, the frame 16 preferably includes a central longitudinal beam 20, with a front transverse beam 22 and rear transverse beam 24 extending horizontally from each end portion of longitudinal beam 20. The longitudinal beam 20 may be hollow, thereby defining a channel 26, dimensioned and configured to serve as a conduit for power supply, control, and signal transmitter wiring. The front transverse beam 22 and rear transverse beam 24 both include means for securing a drive module 18 on either side of the longitudinal beam 20, and to selectively position the drive modules 18 at a desired distance from each other, and from the longitudinal beam 20. The illustrated example includes a ledge 28 on both the front transverse beam 22 and rear transverse beam 24, dimensioned and configured to support a corresponding end brace 30 on each end of the drive module 18. The ledge 28 defines a plurality of apertures 32, and the end bracket 30 defines at least one aperture 34, with the apertures 34 being dimensioned and configured to align with the apertures 32 when the drive module 18 is secured to the frame 16. In the illustrated example, three apertures 34 and six apertures 32 are present. Therefore, by aligning the three apertures 34 with any three adjacent apertures 32, and fastening the end bracket 30 and ledge 28 together utilizing a fastener dimensioned and configured to mate with the apertures 32,34, for example, the screw 35, the drive module 18 may be located at any one of four possible distances from the longitudinal beam 20. Depending on the desired number of possible distances from the longitudinal beam 20 to the drive module 18, the number of apertures 32, 34 may, of course, be varied. The front transverse beam 22 and rear transverse beam 24 also include means for pivotally securing a pair of frames 16 together, for securing a tail section 36 to a rear transverse beam 24, or for securing an effector (described below). In the present example, the hinged attachment 38 provides these connections. The hinged attachment 38 may include means for biasing the secured components towards a coplanar orientation with respect to each other, for example, the springs 40.

Figure 4:
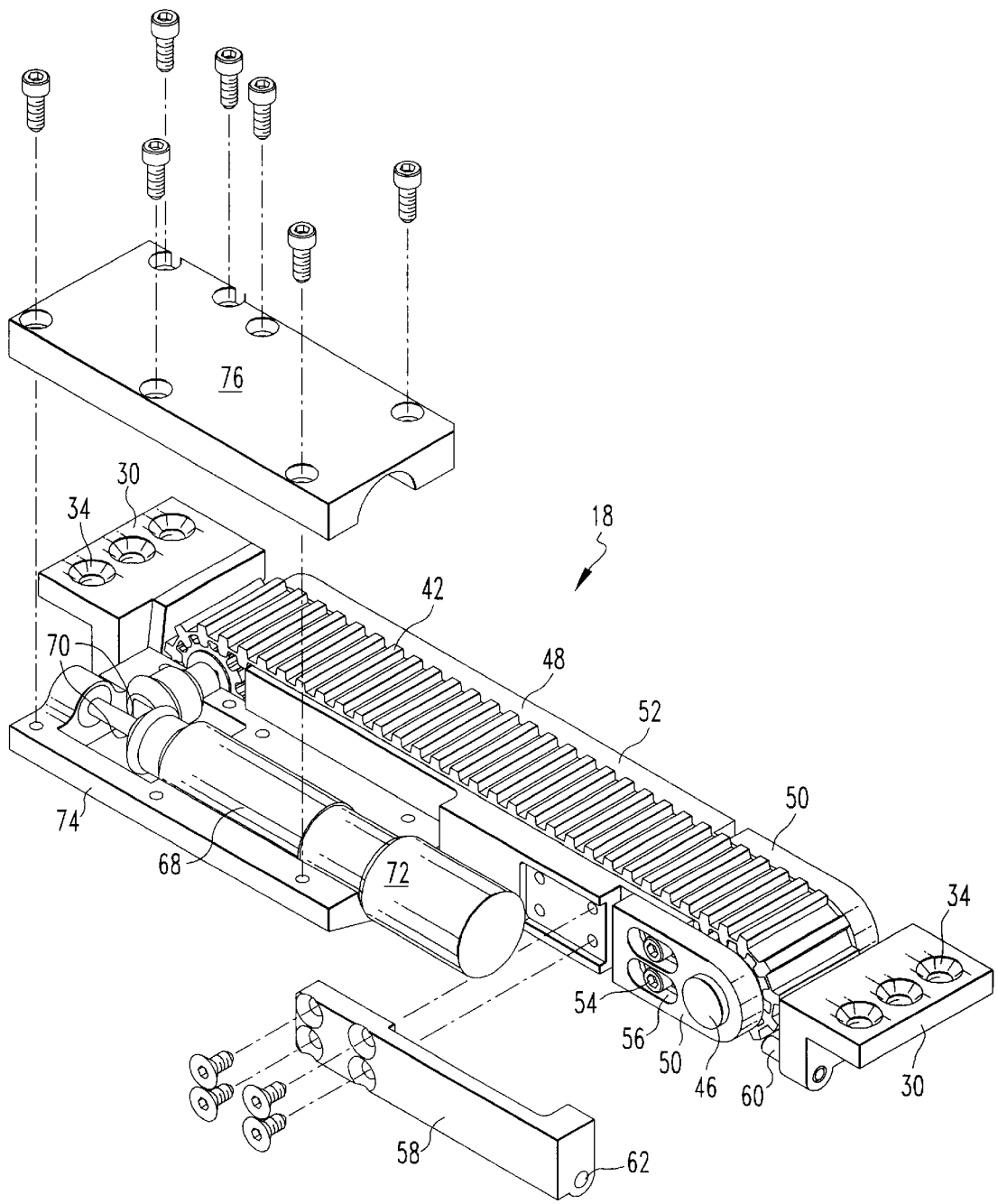
FIG. 4 is a partially exploded view of a drive module of a remote controlled inspection vehicle according to the present invention.
Figure 5:
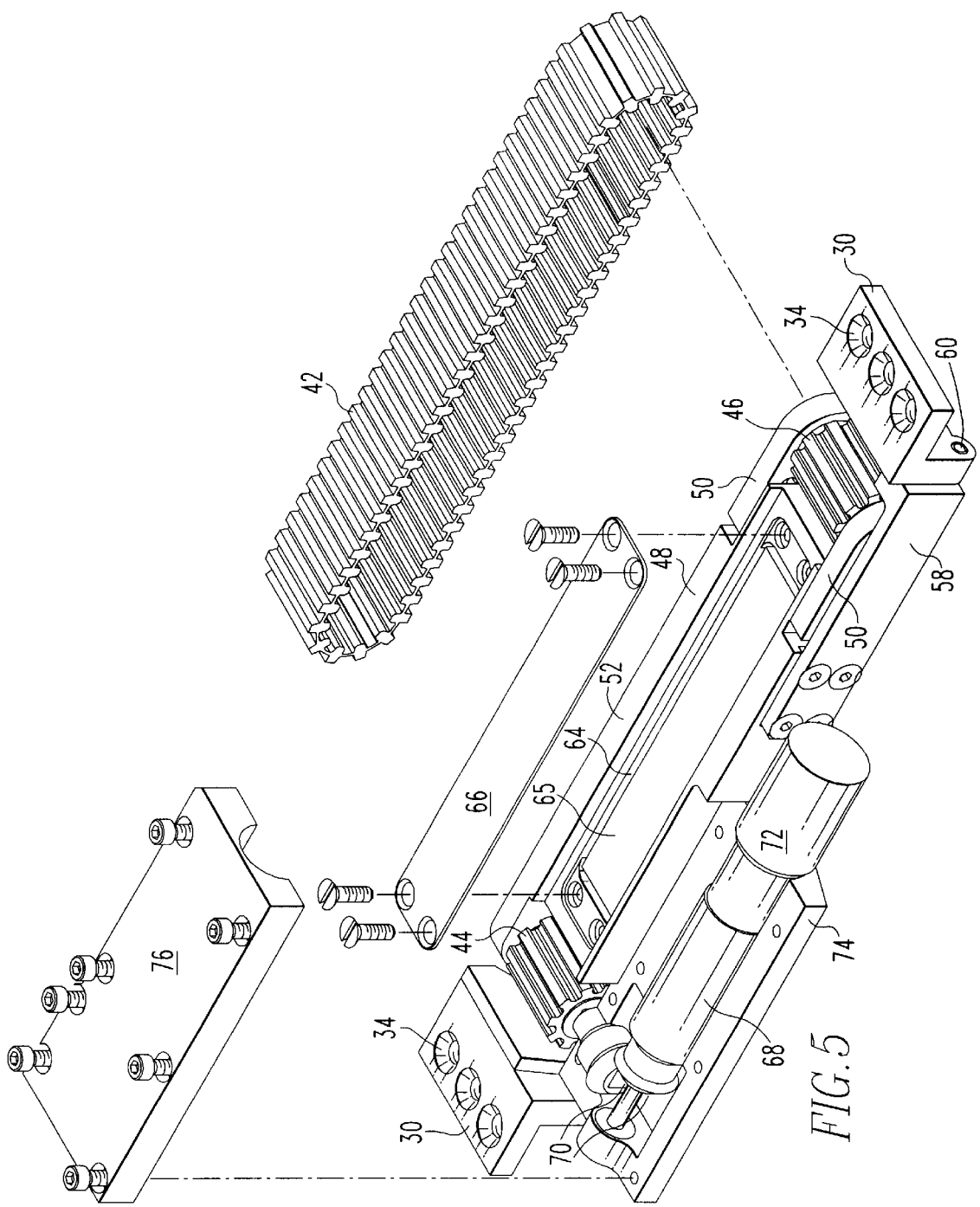
FIG. 5 is a partially exploded view of a drive module of a remote controlled inspection vehicle according to the present invention.
Figure 6:
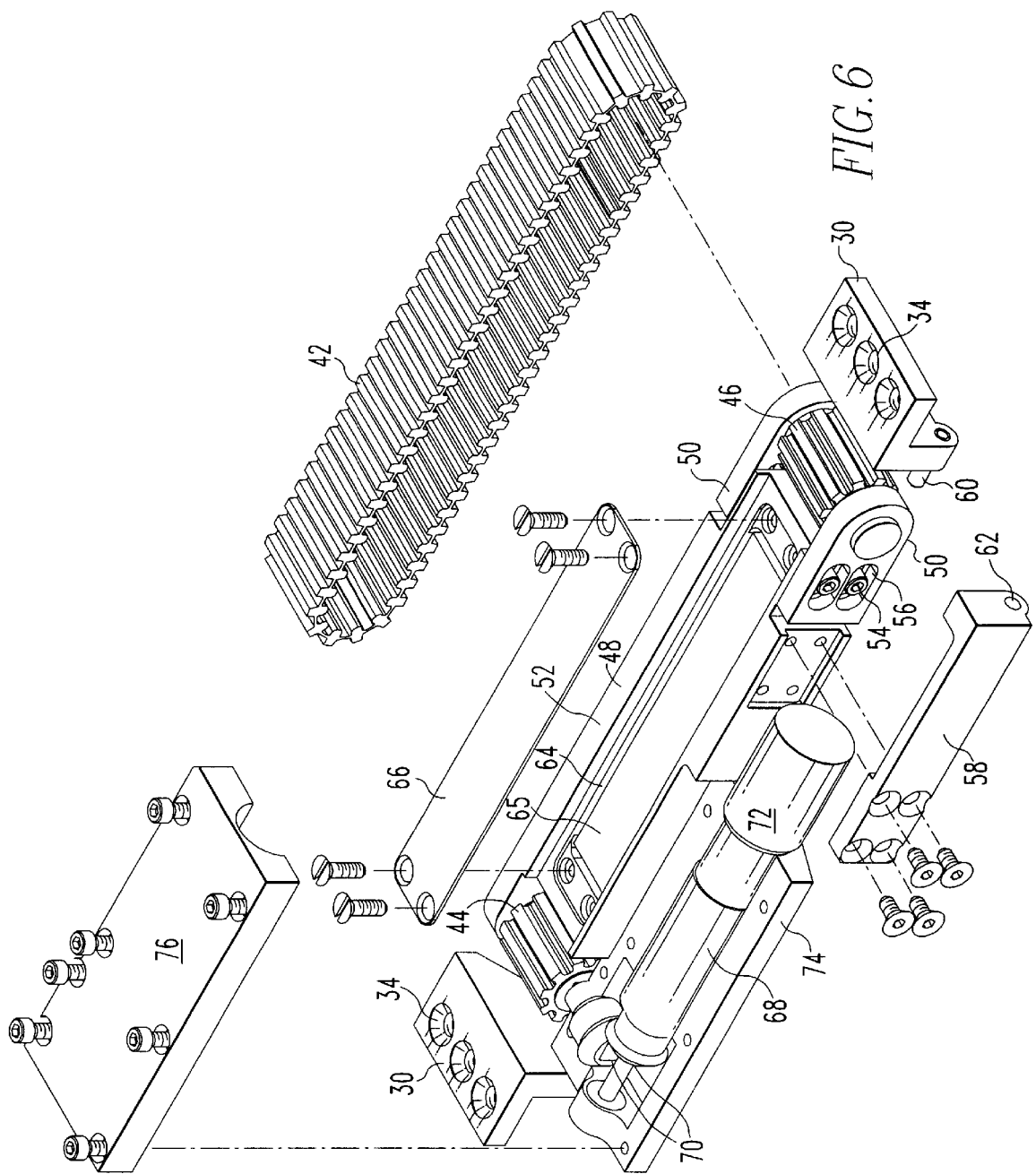
FIG. 6 is a partially exploded view of a drive module of a remote controlled inspection vehicle according to the present invention.

A drive module 18 is illustrated in FIGS. 4–6. The drive module 18 includes a continuous track 42, extending between a drive wheel 44 and an idler wheel 46. The drive wheel 44 and idler wheel 46 are both mounted on the drive module frame assembly 48. The frame 48 may include a slidably mounted idler support 50, slidably secured to the frame 52 by the set screws 54, passing through the slots 56 defined within the idler support 50. The frame assembly 48 also includes an end bracket 30 pivotally secured at each end of the drive module 18, dimensioned and configured to permit the track 42 to pivot around a longitudinal axis. In the illustrated example, the end bracket 30 adjacent to the drive wheel 44 is pivotally secured to the frame 52, and the end bracket adjacent to the idler wheel 46 is pivotally secured to the bracket support 58, which is in turn rigidly and removably secured to the frame 52. The bracket support 58 in the illustrated example extends on top of the setscrews 54, and is therefore removable to permit access to these setscrews 54. The means for permitting the track 42 to pivot in the illustrated example are the pin 60 in the end bracket 30, dimensioned and configured to be received within the hole 62 within the frame 52 and the bracket support 58. The pin 60 and hole 62 may, of course, be reversed. The frame 52 also defines a magnet-receiving region 64 containing magnet 65, located within the track 42, and secured by the cover 66. The magnet 65 will in some preferred embodiments be a permanent magnet.

The drive module 18 is powered by the motor 68, which in the present example is an electric motor, operatively connected through the gears 70 to the drive wheel 44. In the illustrated example, an encoder 72 is operatively connected with the motor 68. The motor 68 and gears 70 are housed within the motor housing portion 74 and motor cover 76 of the frame 52.

Figure 7:
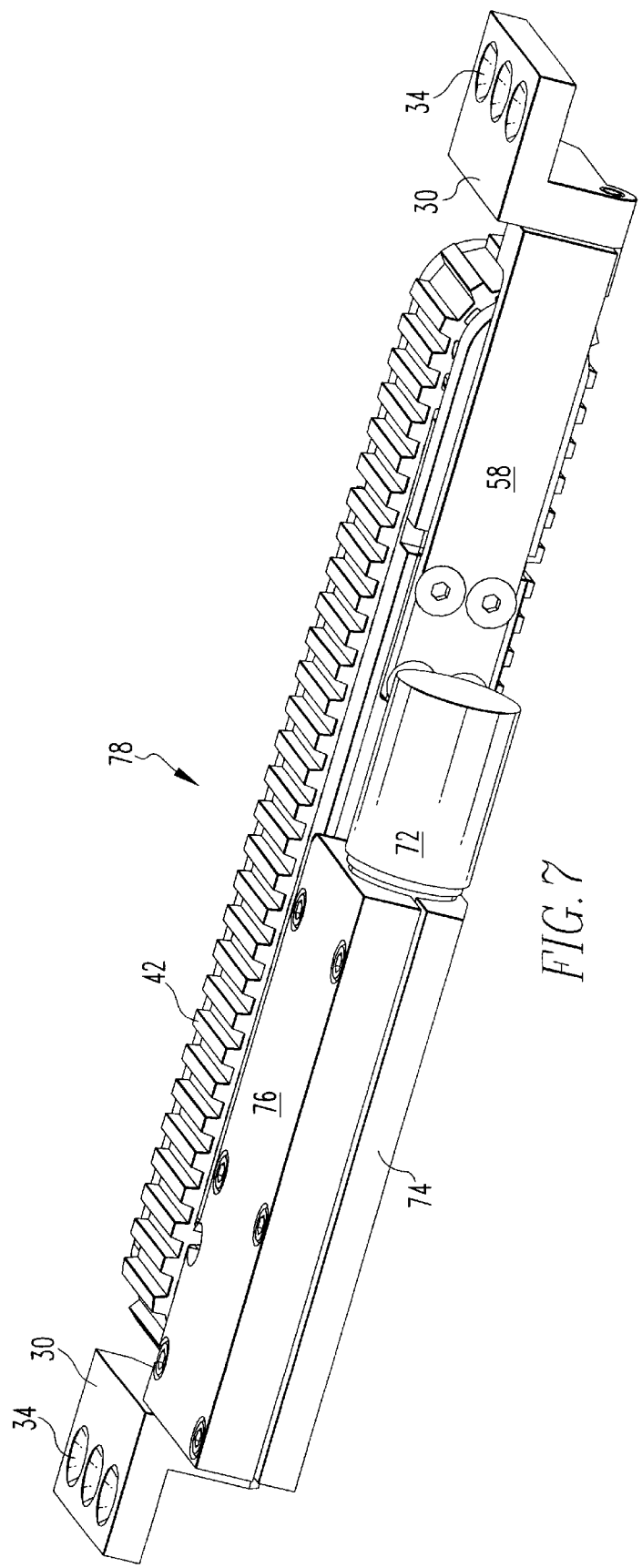
FIG. 7 is a side isometric view of an alternative drive module for a remote controlled inspection vehicle according to the present invention.

As can be seen from the above description, each drive module 18 is an independent, removable, interchangeable unit. Each drive module 18 may be positioned at any drive module location within the vehicle 10, 12. Additionally, the drive module 18 may be installed with either the track 42 or motor 68 adjacent to the longitudinal beam 16. Alternatively, the drive modules 18 may, if desired be replaced by a drive module having a different size track 42, for example, the drive module 78 in FIG. 7, having a larger track 42.

The vehicle 10, 12 will typically be used with an effector, typically an end effector, for performing various inspection within an environment inaccessible to humans, for example, between the rotor and stator of a generator. It has been found that a vehicle of the present invention may be utilized where passage through openings as little as approximately 0.75 inch tall is necessary.

Figure 8:
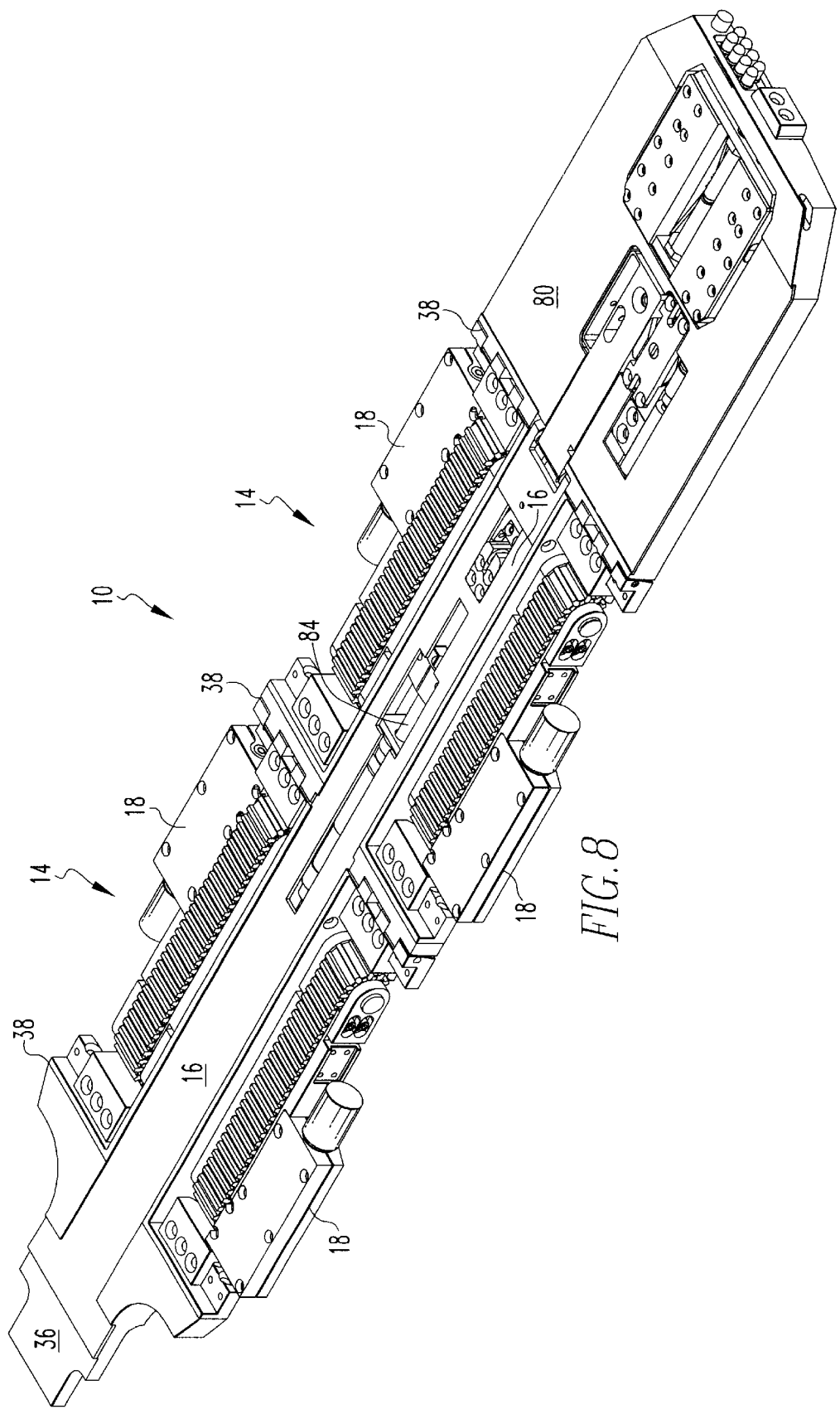
FIG. 8 is a top isometric view of a remote controlled inspection vehicle according to the present invention, illustrating a pair of frame modules, an end effector, and a tail module.
Figure 9:
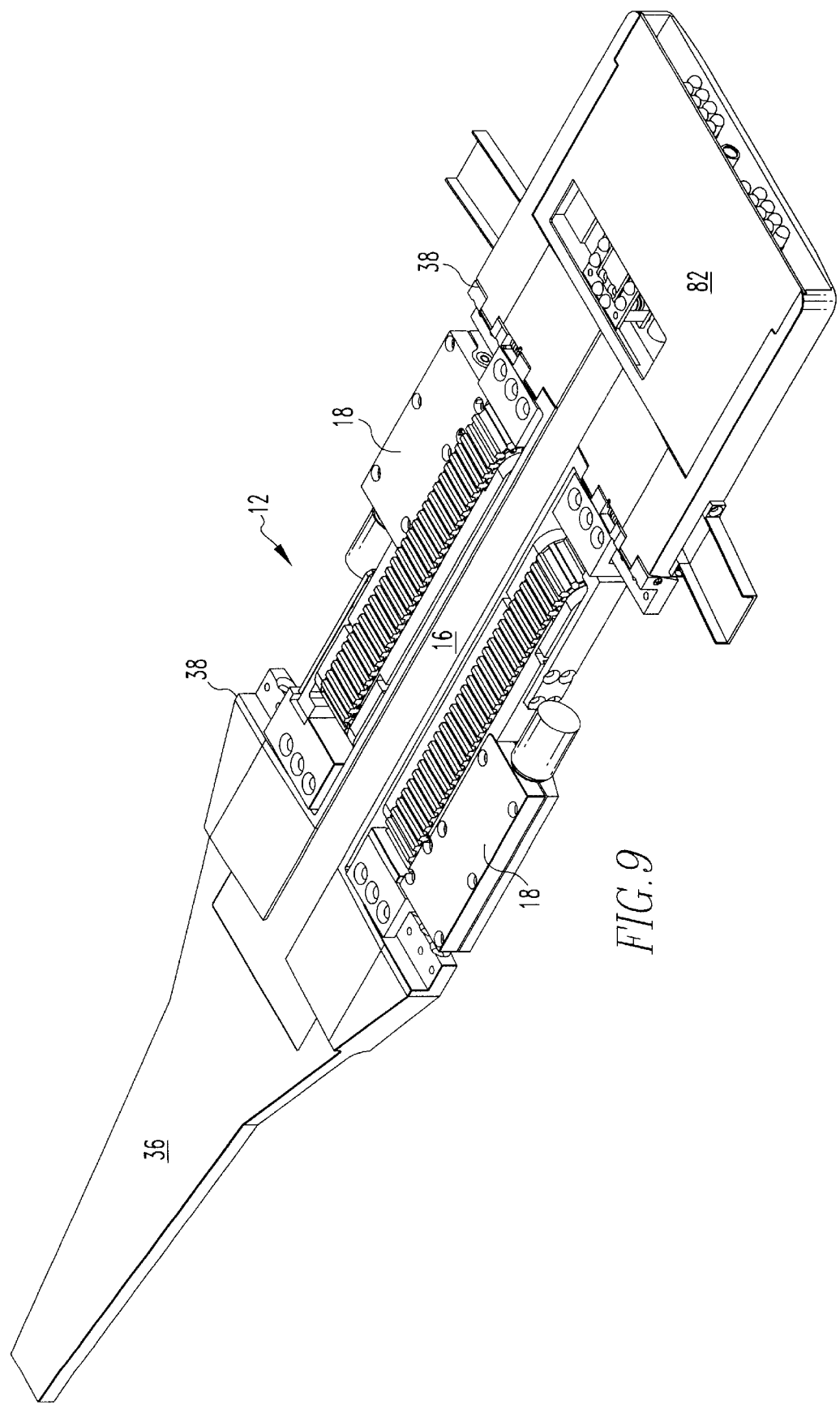
FIG. 9 is a top isometric view of an alternative remote controlled inspection vehicle according to the present invention, illustrating a single frame, and an alternative end effector, and a tail module.

A pair of example end effectors for performing various inspections in conjunction with the vehicles 10, 12 are illustrated in FIGS. 8 and 9. Referring to FIG. 8, an end effector 80 for checking the tightness of the coils within a generator, is illustrated. These coils are held in place in the iron using slot wedges having springs, such as ripple springs, under the wedges. The end effector 80 includes a hammer unit for striking the wedge, and a capacitive measurement probe for sensing the movements of the wedge. The use of the hammer striking unit makes the vehicle 10, having four drive modules 18, desirable. The vehicle 10, with the end effector 80, can therefore be used to inspect the interior of a generator to determine the probability of excessive vibration within that generator.

FIG. 9 illustrates a vehicle 12, having an end effector 82, for detecting electrical shorts between the various layers of laminated iron within the generator. The end effector 82 includes a loop cable and voltage source for inducing a magnetic field, a reference coil, and a sense coil mounted on the bottom of the end effector 82. The end effector 82 senses the differences in magnetic fields between the reference coil and the sense coil, with a change in this difference indicating a short between the generator laminations.

Figure 10:
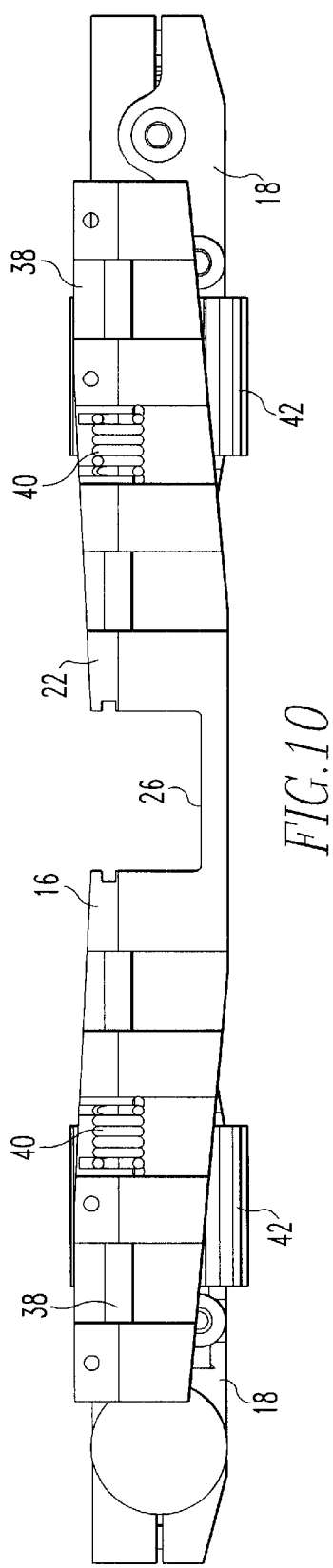
FIG. 10 is a front view of a complete frame unit for a remote controlled inspection vehicle according to the present invention, showing the drive modules in their horizontal orientation.
Figure 11:
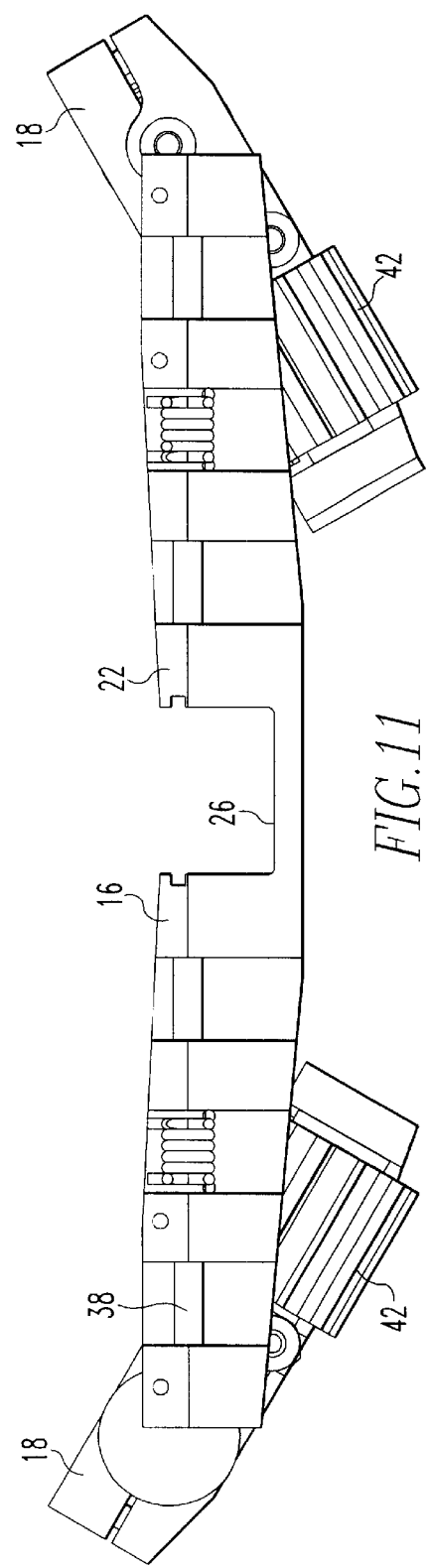
FIG. 11 is a front view of a complete frame module for a remote controlled inspection vehicle according to the present invention, illustrating the drive modules partially rotated to face the tracks partially outward.

To use the vehicle 10, 12, the appropriate number of frames 16 are hingedly joined together using the hinged detachments 38. Typically one or two frames 16 will be used. The appropriate number and configuration of the drive modules 18 are then affixed to the frames 16. A tail section 38 is hingedly secured to the rear transverse beam 24 of the rearmost frame 16. An end effector, for example, the end effectors 80, 82, are hingedly secured to the front transverse beam of the foremost frame 16. The modular construction of the vehicle permits the various components to be connected together in a wide variety of vehicle configurations, and many components may be located at more than one location on the vehicle. For example, a drive module 18 may be located anywhere within a frame 16 wherein a drive module is appropriate, and an individual drive module 18 is not constrained to use with either the right or left side of the vehicle. Electrical power, control, and signal wires 84 are extended from the remote control unit (not shown), through the tail 36, through the channel 26 in the frame's longitudinal beam 20, and to the end effector 80, 82, and motors 68 of the drive modules 18, as best illustrated in FIG. 8. The vehicle 10, 12 is then inserted into the location wherein an inspection is desired, for example, a generator. The hinged attachments 38 will pivot to an extent necessary to keep the tracks 42 in contact with the surface upon which the vehicle 10, 12 travels. In some embodiments, the hinged attachments 38 may permit pivoting of up to approximately 10°. Additionally, referring to FIGS. 10–13, the drive modules 18 will also pivot around an axis defined by the pins 60 and holes 62, providing additional assistance in keeping the tracks 42 in contact with the surface upon which the vehicle is traveling. FIG. 10 illustrates the orientation of the drive modules when the vehicle is traversing a horizontal surface. FIG. 13 illustrates the maximum rotation (approximately 135° in the illustrated example) of the drive modules 18 in one direction (with an equal maximum rotation permissible in the opposite direction), and FIGS. 11 and 12 illustrate other positions in between those of FIG. 10 and FIG. 13. The magnets contained within the magnet retaining regions 64 will cause the vehicle 10, 12 to magnetically adhere to a ferromagnetic surface, permitting the vehicle 10, 12 to traverse non-horizontal surfaces, such as pipes, walls, machinery components, etc. Power will be supplied to the drive wheel 44 of the continuous track 42 by the motor 68, propelling the vehicle 10, 12 forward. The power directed to each drive module 18 may be varied to rotate one continuous track 42 faster than another continuous track 42, thereby permitting the vehicle to turn. If desired, the tracks 42 on one side of the vehicle 10,12 may be rotated one direction and the tracks 42 on the other side of the vehicle 10,12 may be rotated in the opposite direction, thereby permitting the vehicle to rotate about a stationary point to change its direction of travel. The encoder 72 will transmit a signal associated with each turn of the motor 68 to the operator, thereby providing an indication of the location of the vehicle 10, 12.

Although the modular construction of the vehicle 10, 12 permits multiple configurations, it is generally preferred to use a vehicle 12 having a single frame 16 when maximum mobility through minimum spaces is required, and to use a vehicle 10 having two frames 16 and four drive modules 18 when maximum adhesion to the surface upon which the vehicle is traveling is required.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A remote-controlled vehicle, comprising:
   at least one frame;
   a pair of drive modules removably secured to said at least one frame, each of said drive modules having a continuous track, and a motor dimensioned and configured to transmit locomotive force from said motor to said continuous track, said drive module further defining a longitudinal axis, said continuous track being dimensioned and configured to pivot around an axis parallel to said longitudinal axis.

2. The remote-controlled vehicle according to claim 1, wherein said at least one frame includes a longitudinal beam having a front and a rear, a front transverse beam at said front, and a rear transverse beam at said rear, said front and rear transverse beams being dimensioned and configured to removably secure said pair of drive modules between them.

3. The remote controlled vehicle according to claim 2, wherein said front and rear transverse beams are dimensioned and configured to permit selectively mounting said drive modules at one of a plurality of distances from said longitudinal beam.

4. The remote controlled vehicle according to claim 3, wherein each of said drive modules includes a pair of end brackets, each of said end brackets being dimensioned and configured to interchangeably mount on said front transverse beam and said rear transverse beam.

5. The remote controlled vehicle according to claim 4, wherein said each of end brackets include a pivot dimensioned and configured to permit said tracks to pivot around said axis parallel to drive module's longitudinal axis.

6. The remote controlled vehicle according to claim 2, wherein said front and rear transverse beams include means for pivotally and removably securing a vehicle component selected from the group consisting of a second frame, a tail, and an effector.

7. The remote controlled vehicle according to claim 6, wherein said frame and said vehicle component are biased towards a coplanar orientation.

8. The remote controlled vehicle according to claim 2, wherein said longitudinal frame member defines a longitudinal channel dimensioned and configured to contain electrical wiring therein.

9. The remote controlled vehicle according to claim 1, wherein each of said continuous tracks further surrounds a magnet, said magnet being adapted to bias said vehicle towards a ferromagnetic surface.

10. The remote controlled vehicle according to claim 1, further comprising an encoder operatively connected with said motors of said drive modules, said encoders being adapted to transmit a number of rotations of said motor.

11. The remote controlled vehicle according to claim 1, wherein said vehicle is dimensioned and configured to travel through openings as small as approximately 0.75 inch in height.

12. A remote-controlled vehicle, comprising:

at least one frame;

a pair of drive modules removably secured to said at least one frame, each of said drive modules having a continuous track, means for providing locomotive force to said continuous track, said drive module further defining a longitudinal axis and including means for permitting said continuous track to pivot around an axis parallel to said longitudinal axis.

13. The remote controlled vehicle according to claim 12, further comprising means for selectively mounting said drive modules at one of a plurality of distances from each other.

14. The remote controlled vehicle according to claim 12, further comprising:

a front end and a rear end of said frame; and means for hingedly and removably mounting a vehicle component selected from the group consisting of a second frame, a tail, and an effector to said front end and said rear end of said frame.

15. The remote controlled vehicle according to claim 14, further comprising means for biasing said frame and said vehicle component towards a coplanar orientation.

16. A remote-controlled vehicle, comprising:

at least one frame having a longitudinal beam;

a pair of drive modules removably secured to said at least one frame, each of said drive modules having a continuous track, and a motor dimensioned and configured to transmit locomotive force from said motor to said continuous track, each of said drive modules further being selectively mountable on said frame in an orientation selected from the group consisting of said motor adjacent to said longitudinal beam and said track adjacent to said longitudinal beam;

wherein each of said drive modules includes a pair of end braces, and said frame includes a pair of ledges, each of said ledges being dimensioned and configured to removably secure one of said end braces.

17. The remote-controlled vehicle according to claim 16, wherein:

said ledge includes a plurality of substantially uniformly-spaced holes;

said end brace includes at least one aperture dimensioned and configured to align with said holes of said ledge; and said remote-controlled vehicle further including means for removably fastening said ledge and said end brace utilizing said holes in said ledge and said end brace.

* * * * *